(12) United States Patent
Yang

(10) Patent No.: US 7,154,169 B2
(45) Date of Patent: Dec. 26, 2006

(54) SUBSTRATE FOR IC PACKAGE

(75) Inventor: Hsin-Chen Yang, Taichung County (TW)

(73) Assignee: Lingsen Precision Industries, Ltd., Taichung (TW)

( * ) Notice: Subject to any disclaimer, the term of this patent is extended or adjusted under 35 U.S.C. 154(b) by 0 days.

(21) Appl. No.: 11/109,823

(22) Filed: Apr. 20, 2005

(65) Prior Publication Data

US 2006/0220200 A1    Oct. 5, 2006

(30) Foreign Application Priority Data

Apr. 1, 2005   (TW) .............................. 94205139 U

(51) Int. Cl.
*H01L 23/02* (2006.01)
(52) U.S. Cl. ...................... 257/678; 257/703; 257/687; 438/15; 438/26; 438/51; 438/106
(58) Field of Classification Search ................ 257/678, 257/684, 686, 687, 692, 697

See application file for complete search history.

(56) References Cited

U.S. PATENT DOCUMENTS 6,803,254 B1 * 10/2004 Park et al. ................... 438/109
2005/0029645 A1 * 2/2005 Mess et al. .................. 257/686

* cited by examiner

*Primary Examiner*—Brook Kebede
*Assistant Examiner*—Su C. Kim
(74) *Attorney, Agent, or Firm*—Browdy and Neimark, PLLC

(57) ABSTRACT

A packaging substrate is formed of an array of packaging units. Each packaging unit includes a chip pad on which a chip is carried, a plurality of pins arranged around the chip pad and spaced from one another and the chip pad by an open space, an insulative member filling up the open space and forming with the pins and the chip pad a platform, and lead wires located at the insulative member for connecting pins directly or through a passive component.

7 Claims, 4 Drawing Sheets

SUBSTRATE FOR IC PACKAGE

BACKGROUND OF THE INVENTION

1. Field of the Invention

The present invention relates to a substrate for integrated circuit (IC) package and more particularly, to a high density substrate for IC package.

2. Description of the Related Art

Following fast development of technology, it has become the market trend to provide electronic products having lighter, thinner, shorter and smaller characteristics. To fit this market trend, high-performance ICs are developed. From the application of early metal lead frame package technology to current flip chip technology, packaging substrate fabrication has been continuously improved. The invention pertains to improvement on QFN (Quad. Flat No-lead) packaging substrate technology.

QFN semiconductor packaging technology has been intensively used in semiconductor foundries for years for packaging semiconductor products. Several QFN packaging technology based patents have been disclosed. Recently, there are manufacturers to secure pins to the packaging substrate by means of filling up the openings among the pins of the lead frame with an insulative member to form a platform. The platform has one or more chip pads that carry a chip respectively. Passive components or multiple electronic elements may be installed in the platform, increasing space utilization of the packaging substrate.

The aforesaid method of filling up the openings with an insulative member to form a platform greatly increase the usable area of the packaging substrate, however the passive components can only be electrically connected to the adjacent pins, i.e., the aforesaid method does not allow electric connection between two remote pins.

SUMMARY OF THE INVENTION

The present invention has been accomplished under the circumstances in view. It is one object of the present invention to provide a packaging substrate, which allows electric connection between two remote pins.

It is another object of the present invention to provide a packaging substrate, which allows installation of a passive component in the platform thereof to connect two pins.

To achieve these objects of the present invention, the packaging substrate comprises a plurality of packaging units arranged in an array. Each packaging unit has a chip pad carrying a chip, a plurality of pins arranged around the chip pad and spaced from one another and the chip pad by an open space, an insulative member filling up the open space and forming with the pins and the chip pad a platform, and lead wires located at the insulative member to connect pins directly or through a passive component.

DETAILED DESCRIPTION OF THE INVENTION

Figure 1:
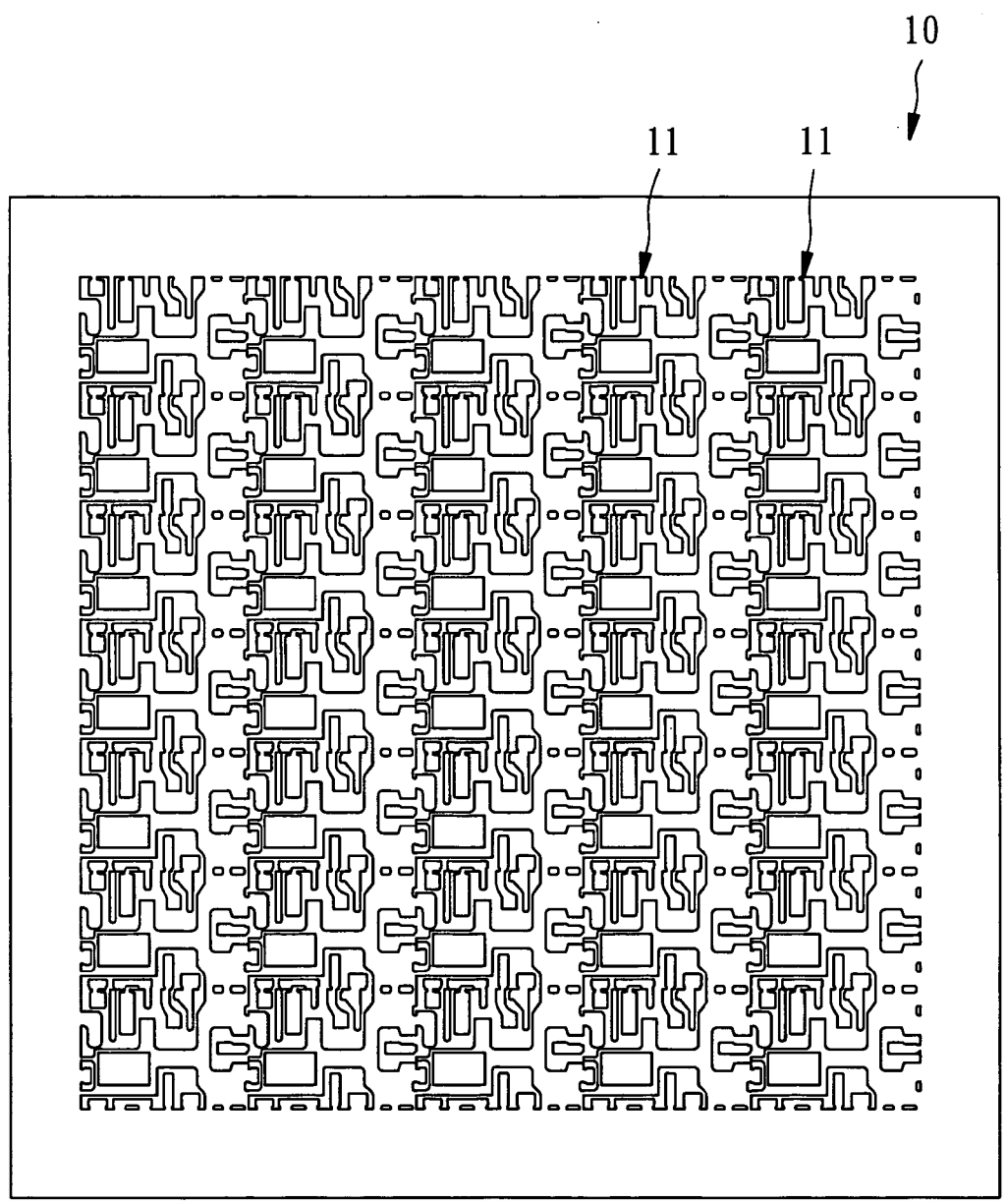
FIG. 1 is a top view of a packaging substrate according to a first preferred embodiment of the present invention.
Figure 2:
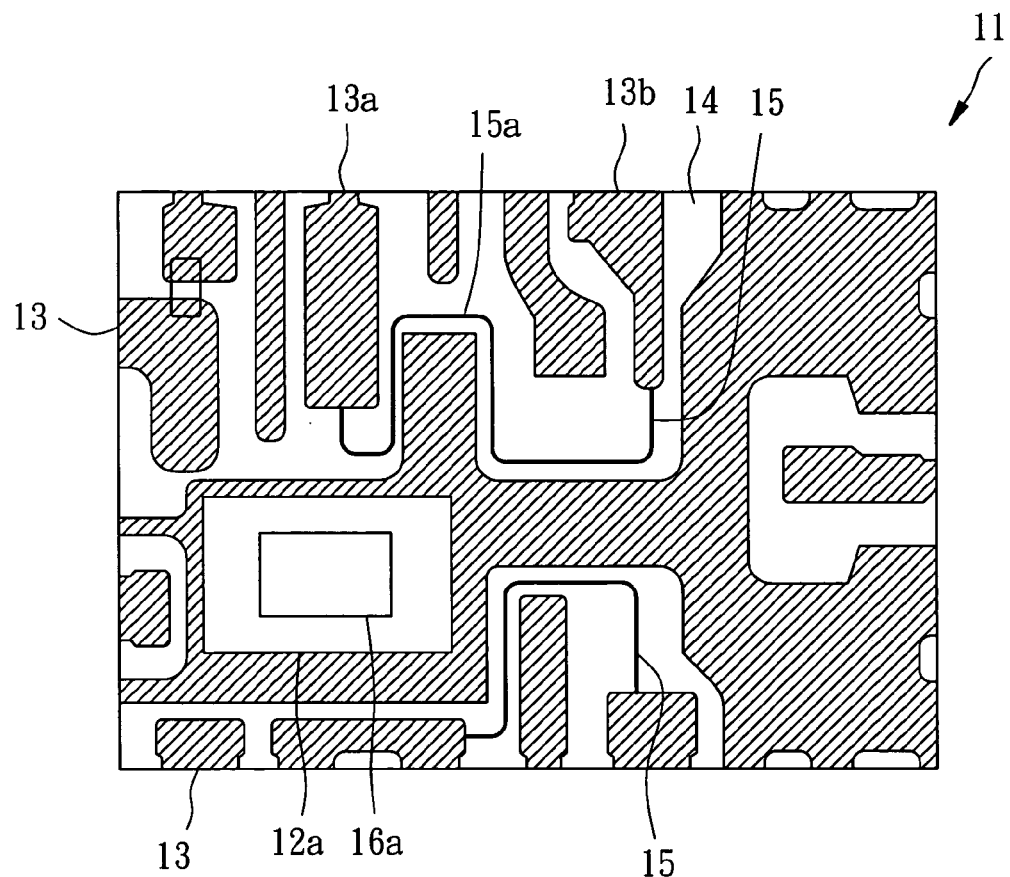
FIG. 2 is a top view in an enlarged scale of the packaging substrate according to the first preferred embodiment of the present.
Figure 3:
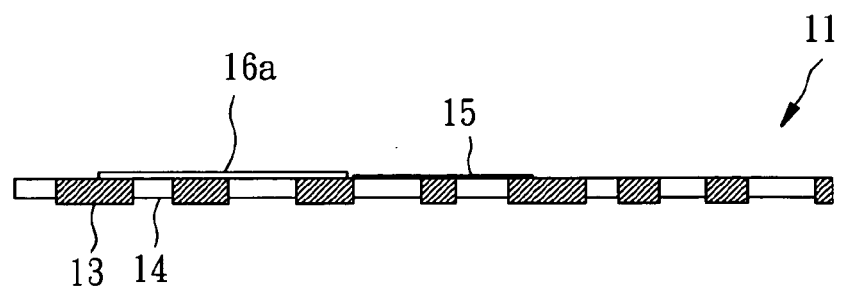
FIG. 3 is a sectional view of a part of the packaging substrate according to the first preferred embodiment of the present invention.

Referring to FIGS. 1–3, a packaging substrate 10 in accordance with the first embodiment of the present invention is shown comprising a plurality of packaging units 11 arranged in an array. The packaging units 11 have a flat, rectangular shape, each comprised of a chip pad 12a, a plurality of pins 13, an insulative member 14, and a plurality of lead wires 15.

The chip pad 12a carries a chip 16a. The pins 13 are arranged along the border of the respective packaging unit 11 around the chip pad 12a subject to a predetermined pattern, and spaced from one another by openings. The insulative member 14 fills up the openings between the pins 13, thereby forming with the pins 13 and the chip pad 12a a unitary platform. The lead wires 15 are made by a nickel alloy and laid in the platform and protruding over the top surface of the area covered by the insulative member 14 (see FIG. 3) to electrically connect each two remote pins 13 that are not adjacent to each other. For example, the lead wire 15a has two ends respectively connected to one end of a first pin 13a and one end of a second pin 13b remote from the first pin 13a, keeping the two remote pins 13a and 13b electrically connected together.

Figure 4:
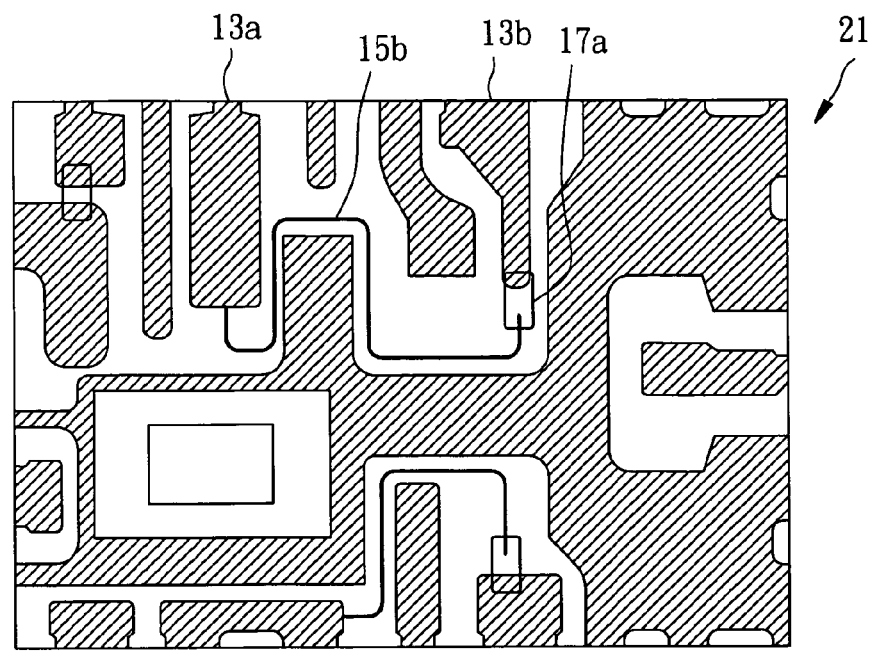
FIG. 4 is a top view of a part of a packaging substrate according to a second preferred embodiment of the present invention.

FIG. 4 shows a packaging substrate according to the second embodiment of the present invention. This embodiment is substantially similar to the aforesaid first embodiment with the exception that in one packaging unit 21, one lead wire 15b has a first end connected to a first pin 13a and a second end extended to a location close to a second pin 13b remote from the first pin 13a, and a passive component 17a, e.g. a resistor, a capacitor, or an inductor, is connected between the second end of the lead wire 15b and the second pin 13b to electrically connect the two pins 13a and 13b.

Figure 5:
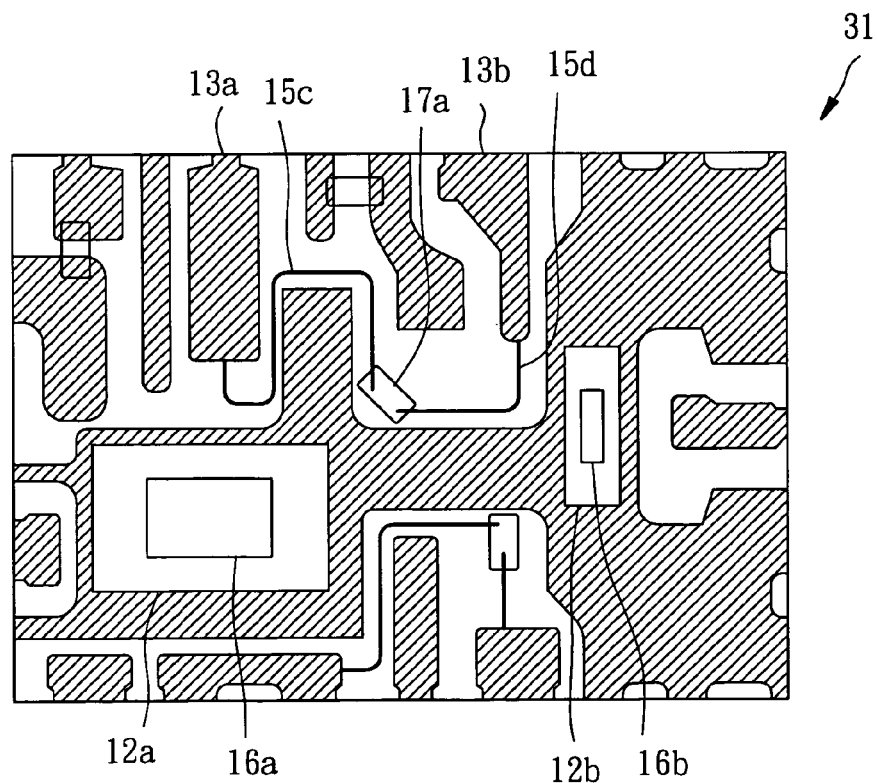
FIG. 5 is a top view of a part of a packaging substrate according to a third preferred embodiment of the present invention.

FIG. 5 shows a packaging substrate according to the third embodiment of the present invention. This embodiment is substantially similar to the aforesaid first embodiment with the exception that a second chip pad 12b is provided in one packaging unit 31 to carry a second chip 16b, enhancing the performance of the respective package unit. Two lead wires 15c and 15d are provided having a respective first end respectively connected to a respective pin 13a or 13b and a respective second end connected to each other through a passive component 17b to electrically connect the two pins 13a and 13b together.

Figure 6:
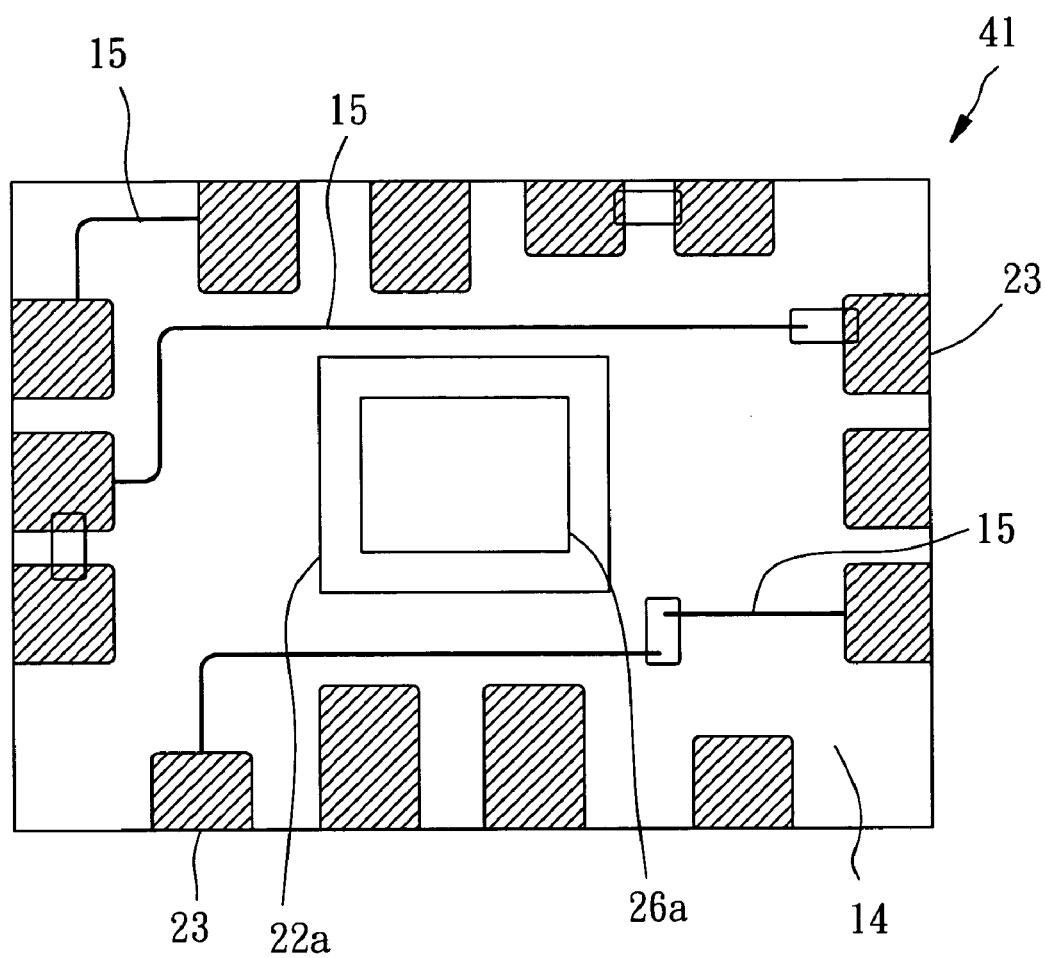
FIG. 6 is a top view of a part of a packaging substrate according to a fourth preferred embodiment of the present invention.

FIG. 6 shows a packaging substrate according to the fourth embodiment of the present invention. According to this embodiment, the pins 23 of the packaging unit 41 are arranged in proper order around the border area of the packaging unit 41. The center area of the packaging unit 41 is provided with a chip pad 22a carrying a chip 26a. The insulative member 14 fills up the space between the chip pad 22a and the pins 23. Lead wires 15 are installed on the insulative member 14 to electrically connect the pins 23 in different manners as the examples of the connection between pins in the aforesaid first, second and third embodiments.

Figure 7:
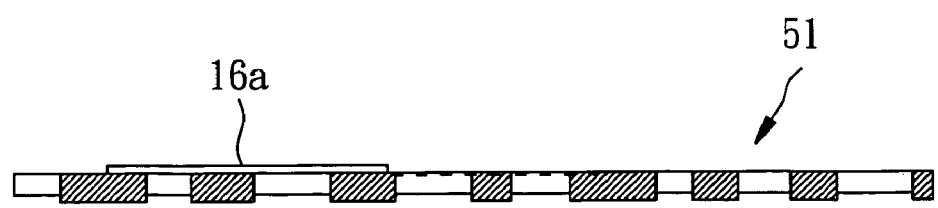
FIG. 7 is a sectional view of a part of a packaging substrate according to a fifth preferred embodiment of the present invention.

FIG. 7 shows a packaging substrate according to the fifth embodiment of the present invention. This embodiment is substantially similar to the aforesaid first embodiment with the exception that the lead wires 15 in the packaging unit 51 are embedded in the insulative member 14 so that the top surface of the packaging unit 51 is maintained smooth.

As indicated above, the present invention provides a high density packaging substrate, which has lead wires laid on the top surface of the insulative member or embedded in the insulative member to connect remote pins directly or through a passive component, making up the deficiency of chip design, and allowing installation of more electronic components in each packaging unit to enhance the performance of the module.

What is claimed is:

1. A packaging substrate comprising a plurality of packaging units arranged in an array, said packaging units each comprising:
   a flat body having portions constituting at least one chip pad for carrying a chip and a plurality of pins arranged around said at least one chip pad and spaced from one another and from said at least one chip pad by open spaces that extend through said flat body; and
   an insulative member filling up said open spaces;
   wherein said packaging units each further comprise:
   at least one lead wire located at said insulative member for connecting said pins, and
   further wherein said flat body and said insulative member together form a unitary platform having a smooth top surface in which said chip pad, said pins and said insulative member all have surface portions that form parts of the smooth top surface.

2. The packaging substrate as claimed in claim 1, wherein said lead wire has two ends respectively connected to two of said pins.

3. The packaging substrate as claimed in claim 1, wherein said lead wire has a first end connected to a first one of said pins and a second end connected to a second one of said pins through a passive component.

4. The packaging substrate as claimed in claim 1, wherein said lead wire is made by a nickel alloy.

5. The packaging substrate as claimed in claim 1, wherein said lead wire is laid on a surface of said insulative member.

6. The packaging substrate as claimed in claim 1, wherein said lead wire is embedded inside said insulative member.

7. The packaging substrate as claimed in claim 1, in combination with a chip carried by said chip pad of at least one of said packaging units.

* * * * *